(12) United States Patent
Sauciuc et al.

(10) Patent No.: US 7,367,195 B2
(45) Date of Patent: May 6, 2008

(54) APPLICATION AND REMOVAL OF THERMAL INTERFACE MATERIAL

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/599,671

(22) Filed: Nov. 14, 2006

(65) Prior Publication Data

US 2007/0068173 A1 Mar. 29, 2007

Related U.S. Application Data

(62) Division of application No. 10/608,634, filed on Jun. 27, 2003.

(51) Int. Cl.
*F25B 21/02* (2006.01)

(52) U.S. Cl. ............................. 62/3.3; 62/3.7

(58) Field of Classification Search ............ 62/3.2, 62/3.3, 3.7; 257/E23.082
See application file for complete search history.

(56) References Cited

U.S. PATENT DOCUMENTS

| | | | |
|---|---|---|---|
| 4,389,557 A | 6/1983 | Devenyi et al. | |
| 4,685,081 A | 8/1987 | Richman | |
| 4,848,090 A | 7/1989 | Peters | |
| 5,457,342 A | 10/1995 | Herbst, II | |
| 5,655,375 A | 8/1997 | Ju | |
| 5,712,448 A * | 1/1998 | Vandersande et al. | 136/203 |
| 6,094,919 A * | 8/2000 | Bhatia | 62/3.7 |
| 6,412,287 B1 | 7/2002 | Hughes et al. | |
| 6,424,533 B1 | 7/2002 | Chu et al. | |
| 6,798,659 B2 | 9/2004 | Chen | |
| 6,845,622 B2 | 1/2005 | Sauciuc et al. | |
| 2004/0118129 A1 | 6/2004 | Chrysler et al. | |

\* cited by examiner

*Primary Examiner*—Melvin Jones
(74) *Attorney, Agent, or Firm*—Blakely, Sokoloff, Taylor & Zafman LLP (57) ABSTRACT

A method, system and apparatus are described. The apparatus includes a first device to adjust a polarity associated with a thermoelectric (TEC) module. The adjustment is to control the flow of heat. The flow of heat is directed toward a thermal interface material (TIM) in order to melt the TIM up to an acceptable melt level. The apparatus further includes a second device to determine whether the TIM has melted up to the acceptable melt level. The apparatus includes an application device to apply the TIM to a heat sink if the TIM is melted has melted up to the acceptable melt level.

20 Claims, 7 Drawing Sheets

APPLICATION AND REMOVAL OF THERMAL INTERFACE MATERIAL

RELATED APPLICATION

This application is a divisional application of U.S. application Ser. No. 10/608,634, filed on Jun. 27, 2003, and entitled "Application and Removal of Thermal Interface Material" the priority of which is hereby claimed.

BACKGROUND OF THE INVENTION

1. Field of the Invention

The invention generally relates to heat transfer assembly, and more particularly to application and removal of thermal interface material (TIM).

2. Description of the Related Art

Integrated circuit (IC) devices and other electronic components are becoming increasingly faster, smaller, and thinner. Today's IC devices also come with added functionalities and capabilities, resulting in generating greater amounts of heat from the IC devices. As a result, IC packages are also getting smaller and are producing greater amounts of heat. The combination of producing greater heat and consuming greater resources, such as current, often results in lower reliability of the IC devices as maintaining the ideal temperature range becomes increasingly difficult. Furthermore, large amounts of heat produced by increasing number of electronic components, such as IC devices, may potentially damage individual electronic components, the IC package, and the equipment. Thus, many attempts have been made to improve the IC package so as to efficiently dissipate excessive heat.

Heat transfer mechanisms available today provide solutions by, for example, restricting the operation of IC devices to lower power levels, lower data rates, and/or lower operating frequencies. Conventional heat transfer mechanisms also have limited heat transfer capabilities due to size, location, and thermal limitations. Lacking an efficient heat transfer mechanism, the speed and power capabilities of the IC device and other electronic components may be severely limited.

Most heat transfer mechanisms employ heat transfer devices, such as heat sinks, to efficiently dissipate excessive heat. A heat sink is typically used as a conductor to dissipate excessive heat to prevent the IC device, and other heat generating electronic components, from overheating. The heat sink may be placed above the IC device with a thermal gap in between the heat sink and the IC device. The thermal gap may be filled with a TIM, such as grease, to provide the thermal conduction path between the heat sink and the IC device to improve heat transfer and dissipation.

A conventional TIM may include a gel, grease, or polymer-like material. However, the performance and reliability of the conventional TIM is typically not very good because of, for example, inherently low thermal conductivity. None of the conventional methods, apparatus, and systems provide for using a TIM that provides better reliability, performance, and thermal conductivity than the conventional TIM.

Furthermore, conventional methods, apparatus, and systems do not related to providing solutions for the application and removal of the TIM that may require a phase change when introduced to and removed from the heat sink. Conventional methods and apparatus are limited to reducing the current TIM thermal resistance, and requiring very high pressure to be applied on the IC package. The application of such high pressure negatively affects the reliability of the IC package and the TIM, resulting in lack of re-workability of the TIM, higher TIM resistance, and decreased TIM reliability.

BRIEF DESCRIPTION OF THE DRAWINGS

The appended claims set forth the features of the present invention with particularity. The embodiments of the present invention, together with its advantages, may be best understood from the following detailed description taken in conjunction with the accompanying drawings of which:

DETAILED DESCRIPTION

A method and apparatus are described for application and removal of thermal interface material (TIM). Broadly stated, embodiments of the present invention provide for improving the application and removal of a TIM using heat control in a heat transfer assembly.

A system, apparatus, and method are provided for applying the TIM to and removing the TIM from a thermal gap of a heat transfer device, such as a heat sink. According to one embodiment, the thermal gap may refer to the area between the heat transfer device and the integrated circuit (IC) device in an IC package, and, according to one embodiment, the thermal gap may be considered a part of the heat transfer device. According to one embodiment, the TIM may be applied at the base of the heat transfer device. According to one embodiment, a phase change material (PCM) or metal-based TIM may be used to provide better conductivity, reliability, and performance by, for example, providing a better bonding between the TIM and various components of the IC package.

According to one embodiment, the polarity of a thermoelectric (TEC) module may be changed to change the direction of heat flow in the heat transfer device. According to one embodiment, changing the direction of heat flow may include reversing the direction of heat flow towards the TIM. According to one embodiment, by redirecting the flow of heat towards, for example, the metallic TIM, the temperature of the metallic TIM may be raised up to the melting temperature of the metal of the metallic TIM. According to one embodiment, the metallic TIM may be applied to the thermal gap or removed from the thermal gap of the heat transfer device with relative ease when the metal is soft or melted.

The embodiments of the present invention include various steps, which will be described below. The steps may be performed manually or using various hardware components or may be embodied in machine-executable instructions, which may be used to cause a processor or machine or logic circuits programmed with the instructions to perform the steps. Furthermore, the steps may be performed manually and/or automatically.

In the following description, for the purposes of explanation, numerous specific details are set forth in order to provide a thorough understanding of the present invention. It will be apparent; however, to one skilled in the art, based on the disclosure provided herein, that the embodiments of the present invention might be practiced without some of these specific details. For example, structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. In other instances, well-known structures and devices are shown in block diagram form.

Figure 1:
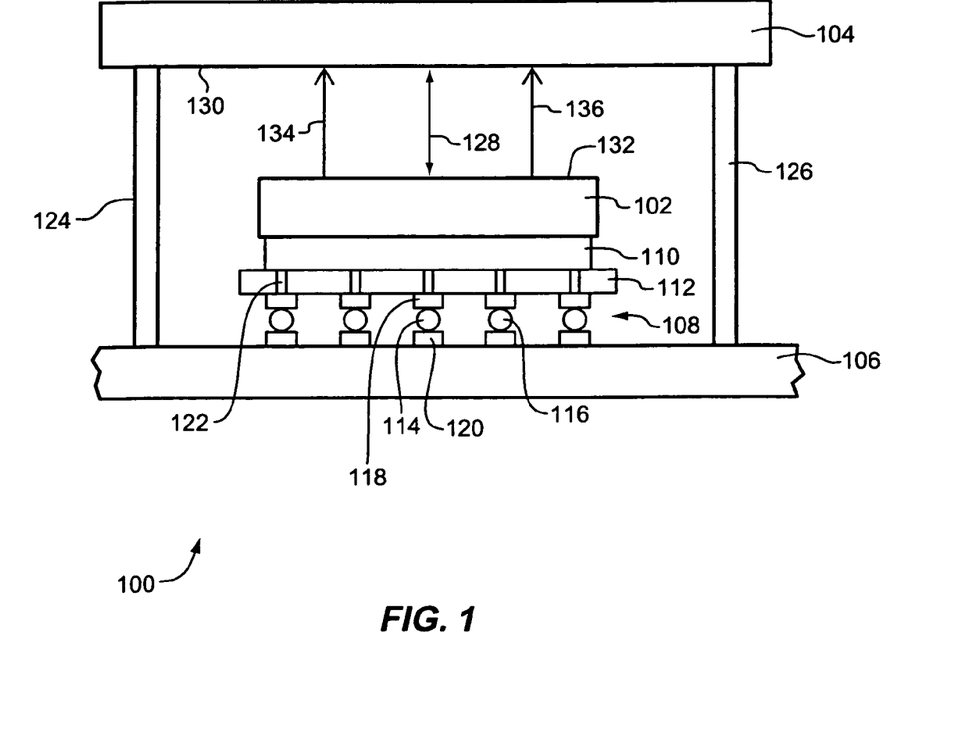
FIG. 1 illustrates a cross-sectional view of a conventional integrated circuit package.

FIG. 1 illustrates a cross-sectional view of a conventional integrated circuit package. As illustrated the integrated circuit (IC) package (package) 100 may include an electronic component or circuit 102 (chip), such as an IC circuit device or a semiconductor device or a silicon chip, packaged (or coupled) with a printed circuit board (PCB) 106 and with a mounted heat transfer device, such as a heat sink 104. The chip 102 may be the primary heat source for producing and emitting heat. Typically, the chip 102 may be coupled with a die pad 112 using an adhesive material 110. The die pad 112 may rest on a board (not illustrated), such as a laminated board, having an insulation layer. Additional layers or surfaces or boards may be included and placed or stacked upon each other. The additional pattern layers may be electronically connected with the top of the chip 102 using wires.

As illustrated, the package may also include a ball grid array (BGA) 108 including a grid of solder balls, such as solder balls 114 and 116, also known as solder interconnection balls or solder bumps, as its joints to connect the chip 102 with the PCB 106 using solder joints, such as solder joints 118 and 120. Solder balls 114 and 116, which may be placed in a selective pattern, such as in rows and columns, may be used to transmit electrical signals between the chip 102 and the PCB 106. Solder balls may serve as ground or power source contacts. Furthermore, solder balls may be used to dissipate heat away from the chip 102 by, for example, transferring the heat to the various heat dissipating points on the PCB 106. Solder joints 118 and 120 may also provide connection between the PCB 106 and the chip 102 via their connection with contacts in the PCB 106, and with the chip 102 by vias, such as the vias 122.

As illustrated, a heat transfer device 104 include a metal block or plate forming a heat dissipating element, such as the heat sink, may be coupled with the PCB 106. The heat transfer device 104 may be coupled with the PCB 106 using multiple supports, such as supports 124 and 126. There may be a gap, known as the thermal gap 128, between the bottom surface 130 of the heat sink 104 and the top surface 132 of the chip 102. Typically, a highly thermal conductive material may be used to fill the thermal gap 128 to dissipate the heat away from the chip 102 towards the heat sink 104. The highly thermal conductive material, which is well known as thermal interface material (TIM), may typically include polymer, gel, and grease. The direction of the heat being dissipated from away from the chip 102 towards the heat sink 104 is illustrated by arrows 134 and 136.

Figure 2:
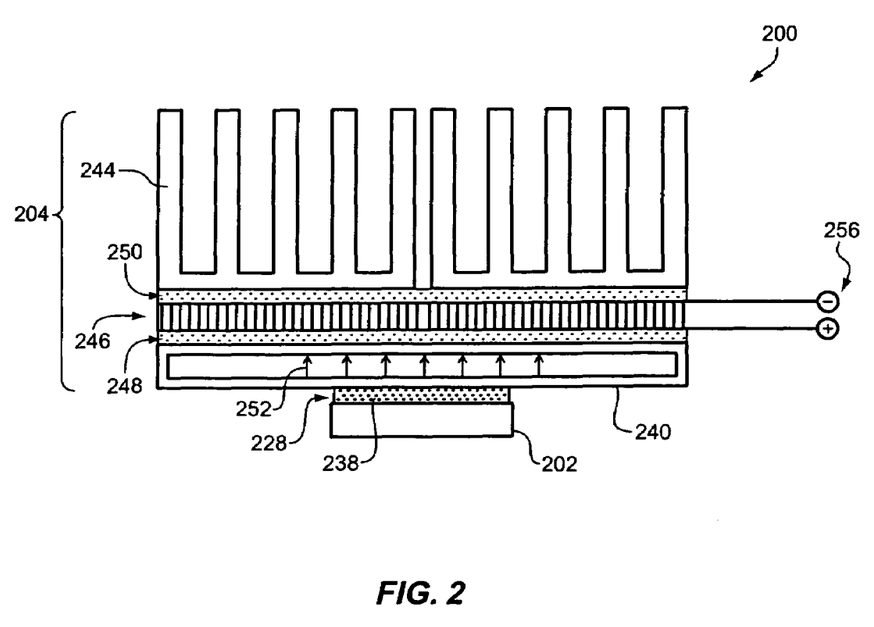
FIG. 2 illustrates an embodiment of a cross-sectional view of a heat transfer assembly.

FIG. 2 illustrates an embodiment of a cross-sectional view of a heat-transfer assembly. A heat transfer or heat sink assembly (assembly) 200 may include a heat transfer device, such as the heat sink 204. As illustrated, the heat sink 204 may be mounted on the heat source (chip) 202 and coupled with a printed circuit board (PCB) (not illustrated) to dissipate excessive heat away from the chip 202 and towards the heat sink 204. The heat sink 204 may be mounted on the chip 202 such that there may be a gap, known as the thermal gap 228, between the bottom surface of the heat sink 204 and the top surface of the chip 202. According to one embodiment, thermal interface material (TIM) 238 may be applied to the thermal gap 228 provide better conductivity and reliability by dissipating excessive heat away from the chip 202 and thus, help cool the chip 202. According to another embodiment, TIM 238 may be applied at the base of the heat sink 204, but not necessarily in the thermal gap 228.

Typically, a highly thermal conductive material may be used as TIM 238. For example, TIM 238 may include inherently soft material, such as polymer, gel, or grease, to fill the thermal gap 228 to dissipate the heat away from the chip 202 towards the heat sink 204. Inherently soft materials, such as polymer, gel, and grease, may not require a phase change when applied to or removed from the thermal gap 228. According to one embodiment, TIM 238 may include a phase change material for providing better conductivity and reliability. Such phase change material may be wax-like and may require a phase change when applied to or removed from, for example, the thermal gap 228.

According to one embodiment, TIM 238 may be metallic, including a solder-type material, such as indium (symbol: In), or indium alloy, or the like. According to one embodiment, metals with a melting temperature range of 60-300 degrees Celsius may be used as the TIM 238. For example, indium having a melting temperature of 157 degrees Celsius or tin-silver (symbol: Sn—Ag) having a melting temperature of 226 degrees Celsius may be used. According to one embodiment, metallic TIM 238 may provide much better conductivity, reliability, and performance than a conventional TIM by, for example, providing a metallic bond between various components of the assembly 200, such as between a copper, gold, or nickel-plated integrated or integral heat spreader (IHS) and a nickel-plated heat sink, such as the heat sink 204. However, metallic TIM 238 may be inherently solid and may require phase change when applied to and removed from the heat sink 204.

According to one embodiment, the assembly 200 may include a sealed vapor chamber 240 and heat exchanges or heat dissipating fins or thin base fins (fins) 244. According to one embodiment, the vapor chamber 240 may include a phase change fluid when using phase change material refrigeration to dissipate heat away from the chip 202. According to one embodiment, the assembly 200 may also include a thermoelectric element or module (TEC module) 246 positioned at the base of the heat sink 204 of the assembly 200. According to one embodiment, the TEC module 246 at the base of the assembly 200 may be placed between the sealed vapor chamber 240 and the fins 244. As illustrated, the TEC module 246 may have a cold side 248 in thermal contact with the vapor chamber 240 and a hot side 250 in thermal contact with the fins 244. According to another embodiment, the assembly 200 may include one or more TEC modules 246 placed or positioned at various locations at the base of the assembly 200, e.g., at base of the heat sink 204. According to one embodiment, a TEC module 246 at the base of the assembly 200 may be used in the application and removal of the TIM 238.

According to one embodiment, as illustrated by the arrows 252, the direction of the heat flow may be from the chip 202, passing the TIM 238, through the vapor chamber 240, and on towards the TEC module 246. Stated differently, the heat flows away from the TIM 238 through the vapor chamber 240 passing the TEC module 246 towards the fins 244, e.g., from the cold side 248 or the side of the vapor chamber 240, towards the hot side 250 or the side of the fins 244. According to one embodiment, polarity 256 may represent the polarity of the TEC module 246 during normal operating conditions of the assembly 200 and its various components.

According to one embodiment, the TEC module 246 may be used to decrease the temperature of the vapor chamber 240 and/or to increase the temperature of the fins 244 for improved efficiency. According to one embodiment, for a given heat sink base temperature, the TEC module 246 may allow more power to dissipate through, and lower processor temperature may be achieved while dissipating greater processor heat.

According to one embodiment, the TEC module 246 may be semiconductor-based and may refer to any device that operates as heat pump. For example, when voltage or current is applied to the TEC module 246, heat may be transferred from a first side of the TEC module 246 to a second side of the TEC module 246, cooling the first side and heating the second side. According to one embodiment, the amount of heat transferred may be a function of the applied voltage.

The fins 244 may include a heat exchange device or element or component. The fins 244 may include folded fins, parallel plates, extruded fins, offset strip fins, pin fins (staggered or in-line), or the like. According to one embodiment, the fins 244 may be made of an individual mesh piece. For example, the fins 244 may be made as folded fins formed from a single mesh sheet that may be folded, such as in the accordion style, to provide a plurality of parallel or generally parallel fins. The fins 244 may be attached to the rest of the heat sink 204 by soldering, welding, or brazing.

The chip 202 may include any computational or processing circuit, such as a microprocessor, a microcontroller, a graphics processor, a graphics card, a graphics chip, an electronic circuitry, a chipset, a power converter component or device, a digital signal processor (DSP), a complex instruction set computing (CISC) processor, a reduced instruction set computing (RISC) processor, or a very long instruction word (VLIW) processor. The chip 202 may be part of a computer system or physical machine, such as a mainframe computer, a handheld device, a workstation, a server, a portable computer, a set-top box, an intelligent apparatus or system or appliance, a virtual machine, or any other computing system or device.

Figure 3:
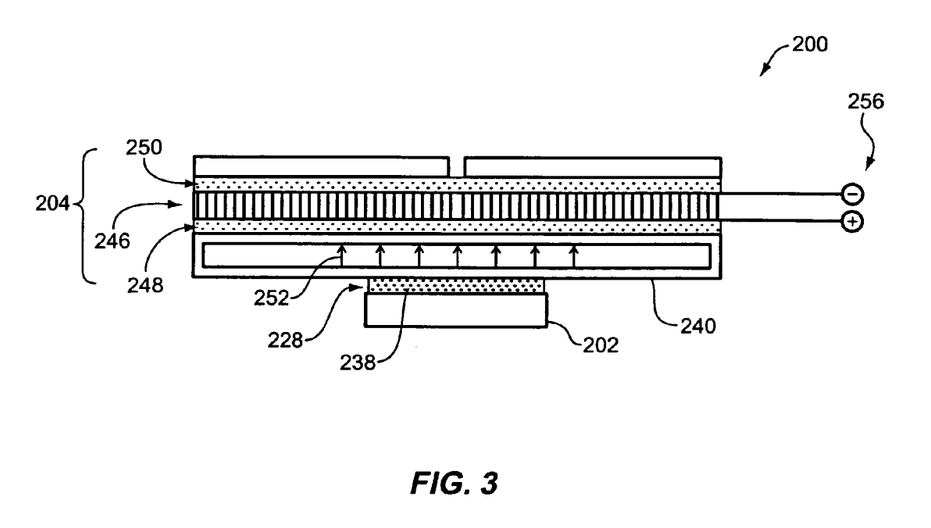
FIG. 3 illustrates an embodiment of a close-up cross-sectional view of a heat transfer assembly.

FIG. 3 illustrates an embodiment of a close-up cross-sectional view of a heat transfer assembly. As illustrated, a heat transfer or heat sink assembly (assembly) 200 may include a heat transfer device, such as the heat sink 204, mounted on or coupled with a heat source or chip (chip) 202. The assembly 200 of FIG. 2 may include a thermal interface material (TIM) 238 between the chip 202 and a sealed vapor chamber 240. According to one embodiment, a thermoelectric element or module (TEC module) 246 may be placed at the base of the assembly 200 to provide additional support and aid in improving the application and removal of the TIM 238. According to another embodiment, the assembly 200 may include one or more TEC modules 246 placed or positioned at various locations at the base of the assembly 200. According to one embodiment, the TEC module 246 at the base of the assembly 200 may provide additional support and aid in the application and removal of the TIM 238.

According to one embodiment, as illustrated by the arrows 252, the direction of heat flow under normal operating conditions may be from the chip 202 towards the fins 244 through TEC module 246. Stated differently, the heat flows away from the TIM 238 through the vapor chamber 240 passing the TEC module 246 towards the fins 244, e.g., from the cold side 248 or the side of the vapor chamber 240, towards the hot side 250 or the side of the fins 244. According to one embodiment, polarity 256 may represent the polarity of the TEC module 246 during normal operating conditions of the assembly 200 and its various components.

Typically, a highly thermal conductive material may be used as TIM 238. TIM 238 may include inherently soft material, such as polymer, gel, or grease, to fill, for example, the thermal gap 228 to dissipate the heat away from the chip 202 towards the heat sink 204. Inherently soft material, such as polymer, gel, and grease, may not require a phase change when applied to or removed from the heat sink 204. According to one embodiment, TIM 238 may include a phase change material for providing better conductivity and reliability. Such phase change material may be wax-like and may require phase change when applied to or removed from the heat sink 204.

According to one embodiment, TIM 238 may be metallic, including solder-type material, such as indium (symbol: In), or indium alloy, or the like. According to one embodiment, metals with a melting temperature range of 60-300 degrees Celsius may be used. For example, indium having a melting temperature of 157 degrees Celsius or tin-silver (symbol: Sn—Ag), having a melting temperature of 226 degrees Celsius may be used as TIM 238. According to one embodiment, metallic TIM 238 may provide much better conductivity, reliability, and performance than a conventional TIM by, for example, providing a metallic bond between various components of the assembly 200, such as between a copper, gold, or nickel-plated integrated or integral heat spreader (IHS) and a nickel-plated heat sink, such as the heat sink 204. However, metallic TIM 238 may be inherently solid and may require phase change when applied to and removed from the heat sink 204.

Figure 4:
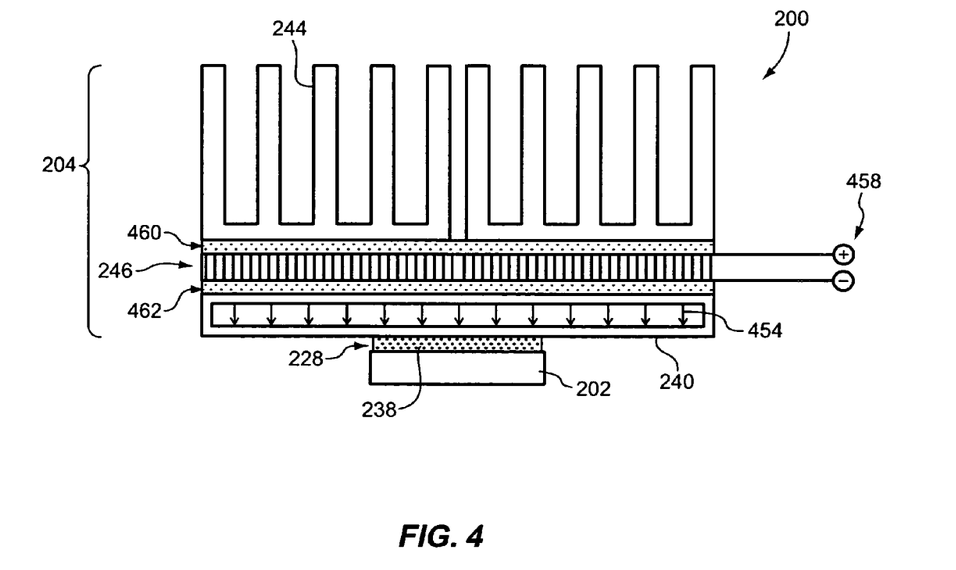
FIG. 4 illustrates an embodiment of a cross-sectional view of a heat transfer assembly.

FIG. 4 illustrates an embodiment of a cross-sectional view of a heat transfer assembly. As illustrated, a heat transfer device or heat sink assembly (assembly) 200 may include a heat transfer device, such as the heat sink 204. As illustrated, the heat sink 204 may be mounted on a heat source (chip) 202 and coupled with a printed circuit board (PCB) (not illustrated) to dissipate excessive heat away from the chip 202 and towards the heat sink 204.

The heat sink 204 may be mounted on the chip 202 such that there may be a gap, known as the thermal gap 228, between the bottom surface of the heat sink 204 and the top surface of the chip 202. Typically, a highly thermal conductive material, also known as thermal interface material (TIM) 238, such as polymer, gel, or grease, may be used to fill the thermal gap 228 to dissipate the heat away from the chip 202 towards the heat sink 204. According to one embodiment, TIM 238 may be used to dissipate excessive heat away from the chip 202 and thus, help cool the chip 202.

According to one embodiment, TIM 238 may be metallic, including solder-type material, such as indium (symbol: In), or indium alloy, or the like. According to one embodiment, metals with a melting temperature range of from 60-300 degrees Celsius may be used. For example, indium having a melting temperature of 157 degrees Celsius or tin-silver (symbol: Sn—Ag) having a melting temperature of 226 degrees Celsius may be used as TIM 238. According to one embodiment, metallic TIM 238 may provide much better conductivity, reliability, and performance than a conventional TIM by, for example, providing a metallic bond between various components of the assembly 200, such as between a copper, gold, or nickel-plated integrated or integral heat spreader (IHS) and a nickel-plated heat sink, such as the heat sink 204. However, metallic TIM 238 may be inherently solid and may require phase change when applied to and removed from a heat sink 204. According to one embodiment, metallic TIM 238 may be applied in the thermal gap 228 between the heat sink 204 and the chip 202. According to another embodiment, metallic TIM 238 may be applied at the base of the heat sink 204, but no necessarily in the thermal gap 228.

According to one embodiment, the assembly 200 may include a sealed vapor chamber 240 and heat exchanges or heat dissipating fins or thin base fins (fins) 244. According to one embodiment, the vapor chamber 240 may include a phase change fluid when using phase change material refrigeration to dissipate heat away from the chip 202. According to one embodiment, the assembly 200 may also include a thermoelectric element or module (TEC module) 246 positioned at the base of the heat sink 204 of the assembly 200. According to one embodiment, the TEC module 246 at the base of the assembly 200 may be between the sealed vapor chamber 240 and the fins 244. As illustrated, TEC module 246 may have a cold side 248 in thermal contact with the vapor chamber 240 and a hot side 250 in thermal contact with the fins 244. According to another embodiment, the assembly 200 may include one or more TEC modules 246 placed or positioned at various locations at the base of the assembly 200. According to one embodiment, the TEC module 246 at the base of the assembly 200 may provide support and aid in the application and removal of the TIM 238.

According to one embodiment, as illustrated by the arrows 454, the direction of the heat flow may be changed, e.g., reversed, with respect to, but not limited to, as illustrated in FIGS. 2 and 3. According to one embodiment, the TEC module polarity, such as the polarity 256 as illustrated in FIGS. 2 and 3 may be changed to a different TEC module polarity, such as the polarity 458, as illustrated here. Stated differently, polarity 256, which may be referred to as the TEC module polarity during normal operating conditions of the assembly 200, may be changed, e.g., reversed, to a new polarity, illustrated as the polarity 458. According to one embodiment, the TEC module polarity 256 under normal operating conditions may be changed to the TEC module polarity 458 by, for example, reversing the terminals of the TEC module 246, or a special device or equipment or apparatus may be used to reversed the polarity 256, or the polarity 256 may be changed by making adjustments at and to the power source (not illustrated).

According to one embodiment, by changing the TEC module polarity, such as from 256 to 458, the heat in the assembly 200 may also change its flow, such as reverse its flow. For example, the heat may flow from the TEC module 246 towards the TIM 238 via the vapor chamber 240. Stated differently, the heat may change its course and flow from the cold side 460, e.g., the side of the fins 244 towards the hot side 462, e.g., the side of the vapor chamber 240 and the TIM 238. According to one embodiment, the TEC module polarity 458 may represent the polarity of the TEC module 246 after the change in the TEC polarity 256 of FIGS. 2 and 3 has been made.

According to one embodiment, the change in the heat flow in the assembly 200 directed towards, for example, the metallic TIM 238 may cause the metallic TIM 238 to melt or soften as the temperature caused the by heat flow into the TIM 238 rises to the melting temperature of the metallic TIM 238. Stated differently, with changed polarity and reversed flow of heat, the TIM 238 may melt and become softer as it receives the heat flow. According to one embodiment, the polarity may be changed and the flow of heat reversed at the time of the application or attachment of the TIM 238 to facilitate easy application of the TIM 238 to the heat sink 204, as the softer metallic TIM 238 may be easier to apply as opposed to a solid metallic TIM 238. Similarly, according to one embodiment, the change of polarity and heat flow may be used at the time of the removal or detachment of the TIM 238 to facilitate easy removal of the TIM 238 from the heat sink 204. As with regard to the application of the metallic TIM 238, the softer metallic TIM 238 may be easier to remove from the heat sink 204 as opposed to a solid metallic TIM 238.

According to one embodiment, the changing of the polarity and the flow of heat, may allow the fins 244 to function at their normal convection, e.g., the fan may not be needed to be powered. Furthermore, according to one embodiment, the TEC module 246 may be used by the users without any extra effort or training. According to one embodiment, the heat input by the TEC module 246 may be controlled using a separate circuit to, for example, maintain the reliability of the entire integrated circuit package and all of its components.

According to one embodiment, the TEC module 246 may be semiconductor-based and may refer to any device that operates as heat pump. For example, when voltage or current is applied to a TEC module 246, heat may be transferred from a first side of the TEC module to a second side of the TEC module, cooling the first side and heating the second side. According to one embodiment, the amount of heat transferred may be a function of the applied voltage.

The fins 244 may include a heat exchange device or element or component. The fins 244 may include folded fins, parallel plates, extruded fins, offset strip fins, pin fins (staggered or in-line), or the like. According to one embodiment, the fins 244 may be made of an individual mesh piece. For example, the fins 244 may be made as folded fins formed from a single mesh sheet that may be folded, such as in the accordion style, to provide a plurality of parallel or generally parallel fins. The fins 244 may be attached to the rest of the heat sink 204 by soldering, welding, or brazing.

The chip 202 may include any computational or processing circuit, such as a microprocessor, a microcontroller, a graphics processor, a graphics card, a graphics chip, an electronic circuitry, a chipset, a power converter component or device, a digital signal processor (DSP), a complex instruction set computing (CISC) processor, a reduced instruction set computing (RISC) processor, or a very long instruction word (VLIW) processor. The chip 202 may be part of a computer system or physical machine, such as a mainframe computer, a handheld device, a workstation, a server, a portable computer, a set-top box, an intelligent apparatus or system or appliance, a virtual machine, or any other computing system or device.

Figure 5:
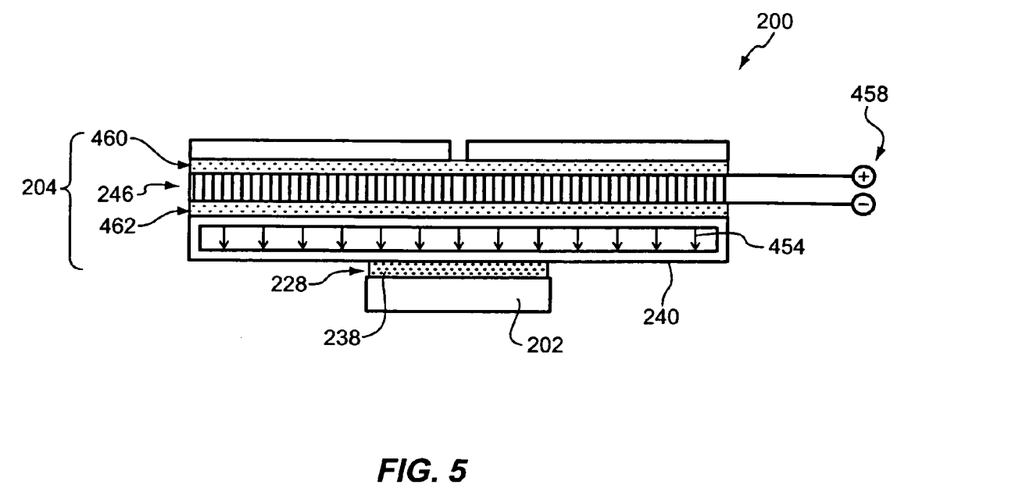
FIG. 5 illustrates an embodiment of a close-up cross-sectional view of a heat transfer assembly.

FIG. 5 illustrates an embodiment of a close-up cross-sectional view of a heat transfer assembly. As illustrated, a heat transfer or heat sink assembly (assembly) 200 may include a heat transfer device, such as the heat sink 204, mounted on or coupled with a heat source or chip (chip) 202. The assembly 200 may include a thermal interface material (TIM) 238 between the chip 202 and a sealed vapor chamber 240. According to one embodiment, a thermoelectric element or module (TEC module) 246 may be placed at the base of the assembly 200 to provide additional support and aid in improving the application and removal of the TIM 238. According to another embodiment, the assembly 200 may include one or more TEC modules 246 placed or positioned at various locations at the base of the assembly 200. According to one embodiment, the TEC module 246 at the base of the assembly 200 may provide additional support and aid in the application and removal of the TIM 238.

According to one embodiment, metallic TIM 238 may provide much better conductivity, reliability, and performance than a conventional TIM by, for example, providing a metallic bond between various components of the assembly 200, such as between a copper, gold, or nickel-plated integrated or integral heat spreader (IHS) and a nickel-plated heat sink, such as the heat sink 204. However, metallic TIM 238 may be inherently solid and may require phase change when applied to and removed from a heat sink 204. According to one embodiment, metallic TIM 238 may be applied in the thermal gap 228 between the heat sink 204 and the chip 202. According to another embodiment, metallic TIM 238 may be applied at the base of the heat sink 204, but no necessarily in the thermal gap 228.

As illustrated by the arrows 454, and as described in reference to FIG. 4, the direction of the heat flow may be changed, e.g., reversed, with respect to, but not limited to, as illustrated in FIGS. 2 and 3. According to one embodiment, the polarity 256 (of FIGS. 2 and 3), which may be referred to as the TEC module polarity during normal operating conditions of the assembly 200, may be changed, e.g., reversed, to a new polarity, illustrated as the polarity 458. According to one embodiment, the TEC module polarity 256 under normal operating conditions may be changed to the TEC module polarity 458 by, for example, reversing the terminals of the TEC module 246, or a special device or equipment or apparatus may be used to reversed the polarity 256, or the polarity 256 may be changed by making adjustments at and to the power source (not illustrated).

According to one embodiment, the change in the heat flow in the assembly 200 directed towards, for example, the metallic TIM 238 may cause the metallic TIM 238 to melt or soften as the temperature caused the by heat flow into the TIM 238 rises to the melting temperature of the metallic TIM 238. Stated differently, with changed polarity and reversed flow of heat, the TIM 238 may melt and become softer as it receives the heat flow. According to one embodiment, the polarity may be changed and the flow of heat reversed at the time of the application or attachment of the TIM 238 to facilitate easy application of the TIM 238 to the heat sink 204, as the softer metallic TIM 238 may be easier to apply as opposed to a solid metallic TIM 238. Similarly, according to one embodiment, the change of polarity and heat flow may be used at the time of the removal or detachment of the TIM 238 to facilitate easy removal of the TIM 238 from the heat sink 204. As with regard to the application of the metallic TIM 238, the softer metallic TIM 238 may be easier to remove from the heat sink 204 as opposed to a solid metallic TIM 238.

Figure 6:
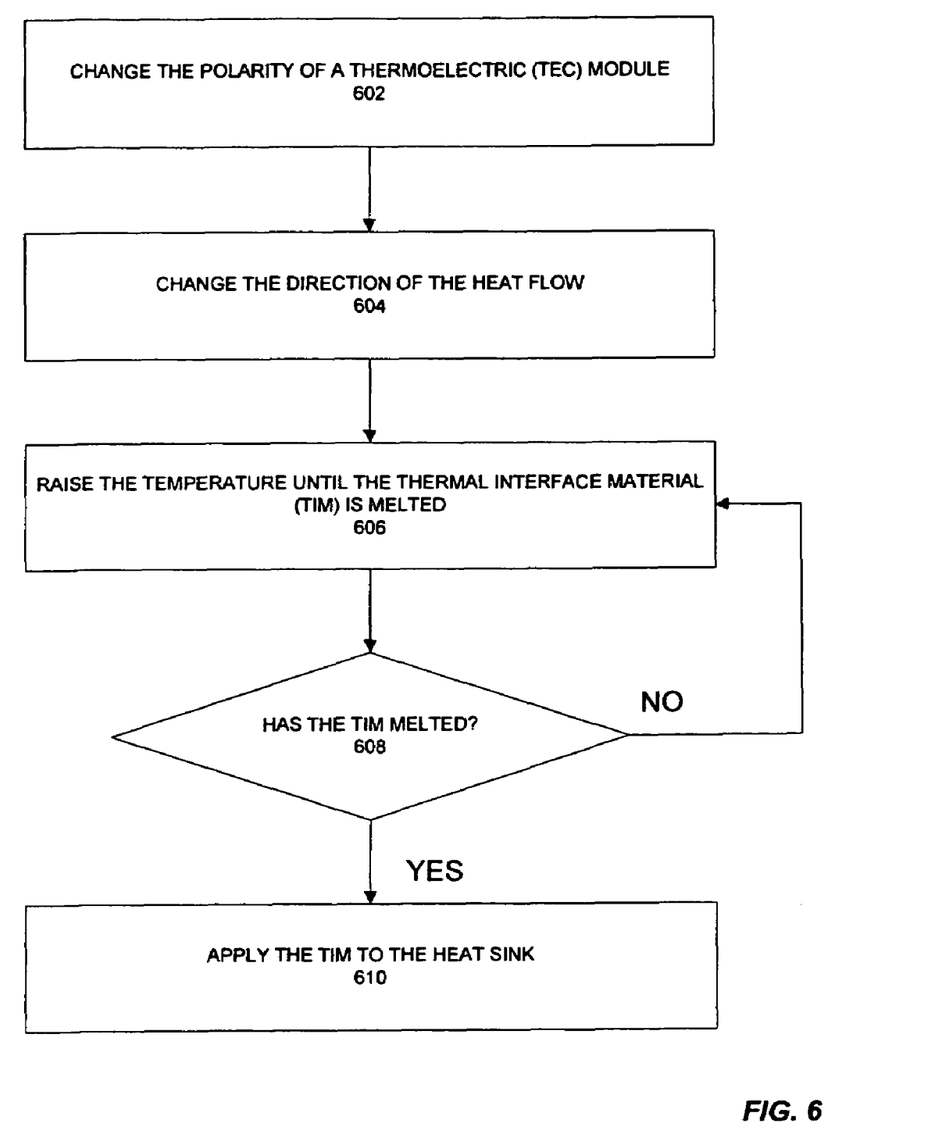
FIG. 6 is a flow chart illustrating an embodiment of a process for applying a thermal interface material (TIM)

FIG. 6 is a flow diagram illustrating an embodiment of a process for applying a thermal interface material. At processing block 602, according to one embodiment, the normal operating polarity of a thermoelectric module or element (TEC module) may be changed, e.g., reversed. Stated differently, the TEC module polarity, which may be referred to as the TEC module polarity during normal operating conditions of the assembly, may be changed, e.g., reversed, to a new polarity. For example, the positive (+) TEC module terminal on the power supply may be switched to the negative (+) TEC module terminal and the negative (−) TEC module terminal may be switched to the positive (+) TEC module terminal. According to one embodiment, the TEC module polarity may be changed to the by, for example, reversing the terminals of the TEC module, or a special device or equipment or apparatus may be used, or the polarity may be changed by making adjustments at and to the power source.

At processing block, 604, the direction of the heat flow may be changed as the TEC polarity has changed. According to one embodiment, the heat flow may change its path and flow towards the thermal interface material (TIM). With this change in the heat flow, heat may be applied to the TIM, such as a metallic TIM. According to one embodiment, TIM may include a phase change material for providing better conductivity and reliability. Such phase change material may be wax-like and may require phase change when applied to or removed from the heat sink. According to one embodiment, TIM may be metallic, including solder-type material, such as indium, or indium alloy, or the like. According to one embodiment, metals with a melting temperature range of from 60-300 degrees Celsius may be used. According to one embodiment, metallic TIM may provide much better conductivity, reliability, and performance than a conventional TIM by, for example, providing a metallic bond between various components of the heat transfer or heat sink assembly (assembly). However, metallic TIM may be inherently solid and require phase change when applied to and removed from a heat sink.

At processing block 606, the temperature of the TIM may rise as a result of the heat flowing into the TIM, until the TIM is melted. At decision block, 608, whether the TIM has melted is determined. According to one embodiment, with rising TIM temperature due to the heat flowing into the TIM, the TIM temperature may reach or get close to the melting temperature of, for example, the metallic TIM, causing the metallic TIM to melt and get softer. According to one embodiment, if the temperature has reached the melting temperature of the TIM and the TIM has melted, the melted TIM may be applied to the heat sink at processing block 610. According to one embodiment, the TIM may be applied in the thermal gap between the heat sink and the chip, or the TIM may be applied to the base of the heat sink, but not necessarily in the thermal gap. An example may include an indium-based TIM reaching or getting close to a temperature of 157 degrees Celsius. According to one embodiment, the TIM may be applied using a dispenser or an applicator, such as an epoxy dispenser machine or a vacuum suction cup, or the like. According to one embodiment, if the temperature as not reached the melting point of the TIM or that the TIM has not yet melted, the process may continue at processing block 608.

Figure 7:
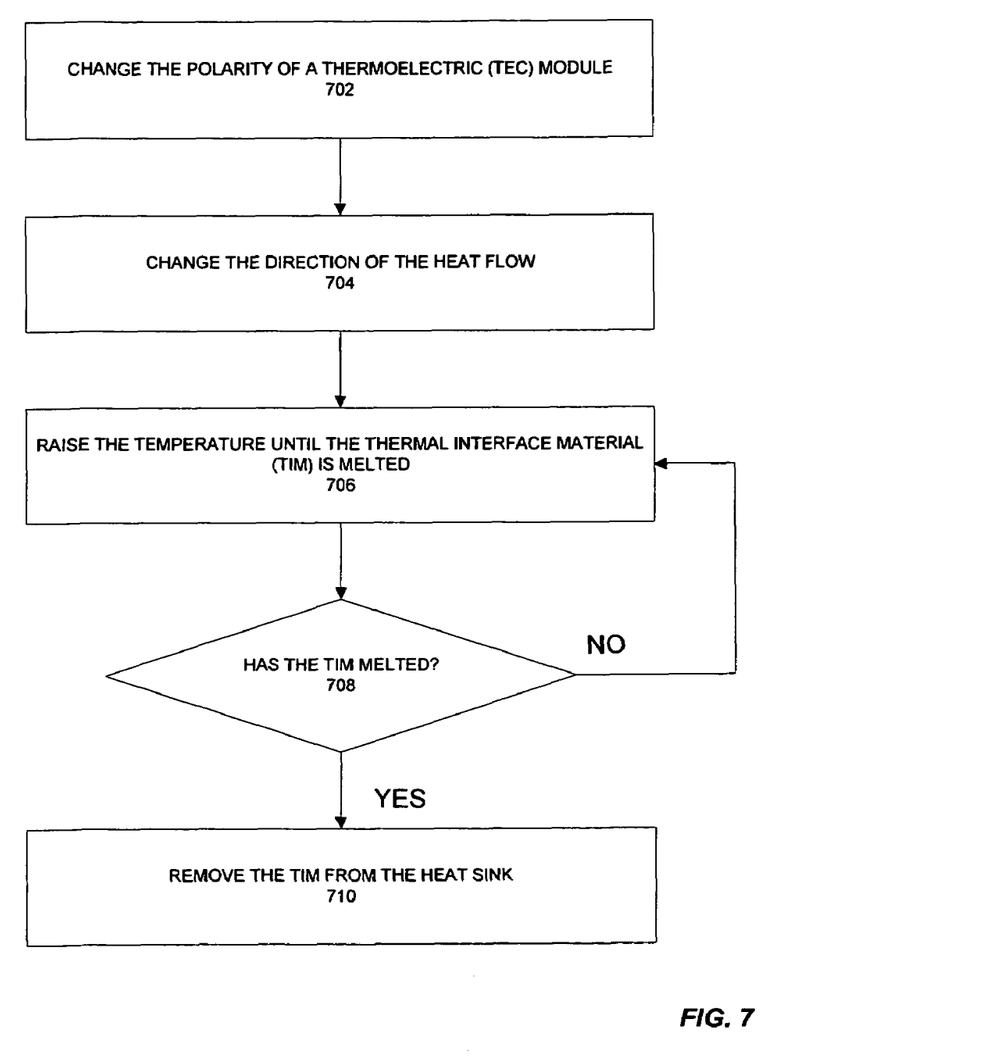
FIG. 7 is a flow chart illustrating an embodiment of a process for removing a thermal interface material (TIM).

FIG. 7 is a flow diagram illustrating an embodiment of a process for removing a thermal interface material. At processing block 702, according to one embodiment, the normal operating polarity of a thermoelectric module or element (TEC module) may be changed, e.g., reversed. Stated differently, the TEC module polarity, which may be referred to as the TEC module polarity during normal operating conditions of the assembly, may be changed, e.g., reversed, to a new polarity.

At processing block, 704, the direction of the heat flow may be changed as the TEC polarity has changed. According to one embodiment, the heat flow may change its path and flow towards the thermal interface material (TIM). With this change in the heat flow, heat may be applied to the TIM, such as a metallic TIM. As described with reference to FIG. 6, according to one embodiment, a phase change material may be used as TIM for providing better conductivity and reliability. According to one embodiment, TIM may be metallic, including solder-type material, such as indium, or indium alloy, or the like, for, for example, providing better performance, conductivity, and reliability in comparison to a conventional TIM. According to one embodiment, metals with a melting temperature range of from 60-300 degrees Celsius may be used. Metallic TIM, however, may be solid and require phase change when applied to or removed from a heat sink.

At processing block 706, the temperature of the TIM may rise as a result of the heat flowing into the TIM, until the TIM is melted. At decision block, 708, whether the TIM has melted is determined. According to one embodiment, with rising TIM temperature due to the heat flowing into the TIM, the TIM temperature may reach or get close to the melting temperature of, for example, the metallic TIM, causing the metallic TIM to melt and get softer. For example, an indium-based TIM may get softer as the temperature reaches or gets close to 157 degrees Celsius. According to one embodiment, if the temperature has reached the melting temperature of the TIM and the TIM has melted, the melted TIM may be removed from the heat sink at processing block 710. According to one embodiment, the TIM may be removed from the thermal gap between the heat sink and the chip, or the TIM may be removed from the base of the heat sink, but not necessarily from the thermal gap. According to one embodiment, the TIM may be removed using a remover device or machine, such as a vacuum suction cup, or the like. According to one embodiment, if the temperature has not reached the melting point of the TIM or that the TIM has not yet melted, the process may continue at processing block 708.

While certain exemplary embodiments of the invention have been described and shown in the accompanying drawings, it is to be understood that such embodiments are merely illustrative of and not restrictive on the broad aspects of various embodiments of the invention, and that these embodiments not be limited to the specific constructions and arrangements shown and described, since various other modifications are possible. It is possible to implement the embodiments of the invention or some of their features in hardware, programmable devices, firmware, software, or a combination thereof.

What is claimed is:

1. An apparatus, comprising:
    a first device to adjust a polarity associated with a thermoelectric (TEC) module to control a flow of heat, wherein the flow of heat is directed toward a thermal interface material (TIM) to melt the TIM up to an acceptable melt level;
    a second device to determine whether the TIM has melted up to the acceptable melt level; and
    a third device to apply the TIM to a heat sink if the TIM is melted has melted up to the acceptable melt level.

2. The apparatus of claim 1, wherein the TIM is applied at one or more of a base of the heat sink and a thermal gap between the heat sink and a heat source.

3. The apparatus of claim 1, wherein the application device includes one or more of an epoxy dispenser machine and a vacuum suction cup.

4. The apparatus of claim 1, wherein the adjusting of the polarity comprises reversing of the polarity.

5. The apparatus of claim 4, wherein the adjusting of the polarity comprises one or more of reversing terminals of the TEC module, and adjusting a power source.

6. A method, comprising:
    directing a heat flow towards a thermal interface material (TIM) to soften the TIM; and
    applying the TIM to a heat sink.

7. The method of claim 6, further comprising removing the TIM from the heat sink.

8. The method of claim 6, wherein directing the heat flow comprises changing a normal heat flow in the heat sink.

9. The method of claim 8, wherein the changing of the normal heat flow comprises reversing the normal heat flow in the heat sink.

10. The method of claim 9, wherein the reversing of the normal heat flow is performed by reversing a polarity of a thermoelectric (TEC) module in the heat sink.

11. The method of claim 10, wherein the reversing of the polarity is performed by one or more of reversing terminals of the TEC module, using a device to change the polarity of the TEC module, and adjusting a power source.

12. The method of claim 6, wherein the TIM is applied using one or more of an epoxy dispenser machine, and a vacuum suction cup.

13. The method of claim 6, wherein the TIM is softened by increasing the TIM temperature until one of the following occurs the TIM temperature reaches the melting point of the TIM, and the TIM temperature is sufficiently close to the melting point of the TIM.

14. The method of claim 6, wherein the TIM comprises one or more of a phase change material, and a metal.

15. The method of claim 14, wherein the metal comprises one or more of indium, an indium alloy, tin, and silver.

16. A system, comprising:
    a first device to adjust a polarity associated with a thermoelectric (TEC) module to control a flow of heat, wherein the flow of heat is directed toward a thermal interface material (TIM) to melt the TIM up to an acceptable melt level;
    a second device to determine whether the TIM has melted up to the acceptable melt level; and
    a third device to apply the TIM to a heat sink if the TIM is melted has melted up to the acceptable melt level.

17. The system of claim 16, wherein the TIM is applied at one or more of a base of the heat sink and a thermal gap between the heat sink and a heat source.

18. The system of claim 16, wherein the application device includes one or more of an epoxy dispenser machine and a vacuum suction cup.

19. The system of claim 16, wherein the adjusting of the polarity comprises reversing of the polarity.

20. The system of claim 19, wherein the adjusting of the polarity comprises one or more of reversing terminals of the TEC module, and adjusting a power source.

* * * * *